(12) United States Patent
Duboc et al.

(10) Patent No.: US 6,587,995 B1
(45) Date of Patent: Jul. 1, 2003

(54) ENHANCED PROGRAMMABLE CORE MODEL WITH INTEGRATED GRAPHICAL DEBUGGING FUNCTIONALITY

(75) Inventors: Jean Francois Duboc, Saint Laurent du Var (FR); Romain Oddoart, Cagnes sur Mer (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/552,395

(22) Filed: Apr. 19, 2000

(51) Int. Cl.[7] .............................................. G06F 17/50
(52) U.S. Cl. ................. 716/4; 716/3; 716/18; 716/7; 703/16; 703/28
(58) Field of Search ............................ 716/4, 18, 3, 7; 703/16, 28

(56) References Cited

U.S. PATENT DOCUMENTS

| | | | | |
|---|---|---|---|---|
| 5,068,823 | A | * 11/1991 | Robinson | 716/16 |
| 5,566,097 | A | * 10/1996 | Myers et al. | 703/15 |
| 5,629,876 | A | * 5/1997 | Huang et al. | 703/20 |
| 5,913,052 | A | 6/1999 | Beatty et al. | 703/15 |
| 6,023,565 | A | * 2/2000 | Lawman et al. | 716/1 |
| 6,028,993 | A | * 2/2000 | Yu et al. | 703/14 |
| 6,173,419 | B1 | * 1/2001 | Barnett | 714/28 |
| 6,321,366 | B1 | * 11/2001 | Tseng et al. | 716/6 |
| 6,324,672 | B1 | * 11/2001 | Lawman et al. | 716/1 |
| 6,453,456 | B1 | * 9/2002 | Price | 716/16 |
| 6,460,172 | B1 | * 10/2002 | Insenser Farre et al. | 716/17 |
| 6,466,898 | B1 | * 10/2002 | Chan | 703/17 |
| 6,473,727 | B1 | * 10/2002 | Kirsch et al. | 703/28 |
| 2002/0073380 | A1 | * 6/2002 | Cooke et al. | 716/1 |
| 2002/0152060 | A1 | * 10/2002 | Tseng | 703/17 |

OTHER PUBLICATIONS

Tiberia, "An Integrated Hardware/Software Development Environment for MIL–STD–1750A Real–Time Applications", 1988 IEEE Aerospace Applications Conference, Feb. 7, 1988, pp. 1–11.*

Parson et al., "Framework Simulating Heterogeneous Virtual Processors", Proceedings of $32^{nd}$ Annual Simulation Symposium, Apr. 11, 1999, pp. 58–67.*

Liu et al., "A Petri Net–based Distributed Debugger", Proceedings of the Fourteenth Annual International Computer Software and Applications Conference, Oct. 31, 1990, pp. 639–646.*

(List continued on next page.)

*Primary Examiner*—Matthew Smith
*Assistant Examiner*—Phallaka Kik
(74) *Attorney, Agent, or Firm*—Peter Zawilski

(57) ABSTRACT

An apparatus, program product and method incorporate into an enhanced programmable core model an embedded debug monitor to provide integrated graphical debugging functionality in the model. The debug monitor supports the performance of one or more debug operations on the programmable core model during simulation thereof. In addition, the debug monitor is configured to receive a debug parameter from a user through a graphical user interface, and report a result of the debug operation to a user via the graphical user interface. Through the use of a graphical user interface, interaction with a user is greatly facilitated. Moreover, by embedding the debug monitor within the programmable core model, a completely integrated simulation and debug environment may be provided to a user, with debugging functionality similar to that available to software developers and hardware-based processor designers. As a result, validation of a model's performance can be performed more efficiently and with less effort.

34 Claims, 5 Drawing Sheets

OTHER PUBLICATIONS

Arnold, "An Architecture Simulator for National Semiconductor's Adaptive Processing Architecture (NAPA)", Proceedings of IEEE Symposium on FPGAs for Custom Computing Machines, Apr. 15, 1998, pp. 271–272.*

Jones et al., "Implementing an API for Distributed Adaptive Computing Systems", Proceedings of the Seventh Annual IEEE Symposium on Field–Programmable Custom Computing Machines, Apr. 21, 1999, pp. 222–230.*

Halambi et al., "Automatic Software Toolkit Generation for Embedded Systems–on–Chip", $6^{th}$ International Conference on VLSI and CAD, Oct. 26, 1999, pp. 107–116.*

NA9006359 ("Technique for Early Detection of Errors", IBM Technical Disclosure Bulletin, vol. 33, No. 1A, Jun. 1990, pp. 359–361 (6 pages)).*

NA9203273 ("Coupled Distributed Parallel Simulation", IBM Technical Disclosure Bulletin, vol. 34, No. 10A, Mar. 1992, pp. 273–277 (8 pages)).*

Apduhan et al., "Experiments of a reconfigurable multiprocessor simulation on a distributed environment", Conference Proceedings of the Eleventh Annual Internationl Phoenix Conference on Computers and Communications, Apr. 1, 1992, pp. 539–546.*

Kirovski, D. et al., "Cut–Based Funtional Debugging for Programmable Systems–On–Chip", *IEEE Transactions on Very Large Scale Integration (VLSI) Systems*, IEEE Inc., New York, US, vol. 8, No. 1 (Feb. 2000), pp. 40–50, XP000912725, ISSN: 1063–8210.

Anonymous, "Leapfrog VHDL Simulator", *Datashee–Cadence*, Online! 1997, XP002178877; URL: http://www.cadence.com/datasheets/dat_pdf/leapfrog.pdf, downloaded, Sep. 28, 2001.

Anonymous, "System Verification Using Multiple Independent Simulation Engines Running Under Common Control", *IBM Technical Disclosure Bulletin*, vol. 30, No. 1, (Jun. 1, 1987), new York, US. pp 340–342, XP002178870.

ModelGen™ Advanced Modeling Tool, *ARM EDA: ModelGen*, http://www.arm.com/DevSupp/EDA/Modelgen/, downloaded Mar. 14, 2000, 3 pages.

*IP Guard™ Product Liturature*, Escalade Corporation, Santa Clara, CA, (1999), 2 pages, Apr. 6, 1999.

Gupta, Rajesh K. et al., "Introducing Core–Based System Design", *IEEE Design & Test of Computers*, (Oct.–Dec. 1997), pp. 15–25.

* cited by examiner

ENHANCED PROGRAMMABLE CORE MODEL WITH INTEGRATED GRAPHICAL DEBUGGING FUNCTIONALITY

FIELD OF THE INVENTION

The invention is generally related to the design and testing of integrated circuits. More specifically, the invention is generally related to debugging computer-aided designed integrated circuits incorporating modular circuit components.

BACKGROUND OF THE INVENTION

As semiconductor fabrication technology advances, designers of integrated circuits are able to integrate more and more functions into a single integrated circuit device, or chip. Whereas chips once included only hundreds or thousands of logic gates, advances in fabrication technology have resulted the ability to place millions of logic gates on a single chip.

Given the increasing complexity of integrated circuit designs, however, the design and testing of such designs has become increasingly difficult. To facilitate these operations, various electronic design automation (EDA) software programs, also referred to as "tools", have been developed to permit a developer to define an integrated circuit design in software at a relatively higher conceptual level, and then perform operations such as synthesizing the physical layout of the integrated circuit design, testing the integrating circuit design, etc., performed with the assistance of a computer. Manufacturing physical chips is often an expensive endeavor, particularly if a particular chip design has to be reworked to correct flaws in the design. As a result, development costs are often minimized by maximizing the amount of design and testing performed in software.

Integrated circuit design has paralleled many of the concepts embodied in object-oriented software design, where commonly-used circuit components are compartmentalized into objects, referred to herein as "circuit blocks", that have been developed, tested and validated for reuse in multiple designs. Design of an integrated circuit can therefore proceed by assembling multiple circuit blocks together to the extent possible, and then developing any "glue logic" necessary to interface the circuit blocks together into an operative design. The functionality encapsulated within circuit blocks has also increased over time, i.e., from relatively simple circuit blocks that represented simple logical components such as multiplexers and registers, to more complex functional components such as bus interfaces, memory arrays and interfaces, test circuits, etc. Some circuit blocks are also developed to interface over standardized interfaces, thereby further minimizing the amount of additional custom circuitry required to implement such blocks in custom designs.

By utilizing an assemblage of pre-existing circuit blocks, development costs and time can be substantially reduced, as a developer is often required to generate only minimal customized circuitry to interface the pre-existing blocks, rather than having to recreate the functionality of all of the blocks from scratch. A circuit designer is also often able to rely on the previous validation and testing performed on pre-existing blocks to eliminate the need to test all of the internal aspects of each and every circuit block in a design.

Circuit block designs have also advanced to the point where complex, programmable processing units such as microprocessors and programmable digital signal processors may be encapsulated into pre-designed and tested "programmable cores" suitable for combining with interface circuitry and other logic to define a custom processing integrated circuit design. Typically, such programmable cores support standardized interfaces such as communication busses, such that any circuit block that is capable of interfacing with such a standardized interface can be integrated with the programmable cores with little or no additional circuitry.

Circuit blocks such as programmable cores typically incorporate both functional information, which defines how the resulting circuit component will respond to particular inputs, as well as synthesis information (e.g., netlists), from which the physical implementation of the circuit component can be synthesized. However, in certain instances, it is desirable to separate functional and synthesis information for a circuit block, particularly if it is desirable to limit third party access to the synthesis information.

For example, it may be desirable for an application specific integrated circuit (ASIC) developer and manufacturer to provide customers with functional information about programmable cores that such customers wish to use in their custom integrated circuit designs, so that the customers can verify the functional operation of the circuit blocks in the custom designs. However, given that development of programmable cores is often expensive and time consuming, it may be important from an intellectual property protection perspective for the synthesis information necessary to actually synthesize and manufacture physical chips using the programmable cores not be disclosed to the customers, for fear of those customers reusing the programmable cores in other designs without the core developer's consent and without compensation to the developer. In addition, often a core developer licenses a standard programmable core design from another entity and customizes the programmable core for use in a particular type of application, paying royalties for each use of the customized programmable core to the owner of the standard design. Often, licensing terms prohibit the disclosure of the synthesis information to third parties, so providing such information to customers of a customized licensed programmable core design would violate the developer's license.

In part to address these concerns, core simulation models have been developed to emulate or mimic the functional characteristics of programable cores, without providing any synthesis information that could be used to generate physical designs of the cores. Core simulation models are typically usable with a simulator program for the purpose of simulating the operational characteristics of a core, as well as to verify the proper interaction of the core with other components in a design. Programmable core models are typically useful when testing a design at various levels of simulation, including, for example, at the register transfer level (RTL) and/or the gate level.

Often, programmable core models are generated for use in a specific simulation environment, i.e., for use with a specific simulator platform. Generic core models have also been developed, which are simulator-independent, and which can be compiled for use with different simulator platforms.

Computer-aided design and testing of programmable core models, however, can be problematic with conventional simulators. Traditionally, software-based hardware simulation enables developers to analyze the states of particular nodes in a design at particular times. However, node state analysis is generally not well suited for analyzing the execution of a computer program by a programmable core, as the states of individual nodes in a programmable core may not be representative of how the programmable core handles the execution of different program instructions. Moreover, given that programmable core models model the overall function of a programmable core, some internal nodes of a programmable core model may not even be accessible to a simulator.

In this regard, testing of a programmable core or its model is more analogous to debugging computer software, as both involve the execution of program instructions. A number of tools have been developed for debugging computer software, providing features such as breakpoints, step-wise execution, traces, disassembly, etc.; however, such functionality has conventionally not be available for programmable cores used in integrated circuit designs. Likewise, debugging functionality has been supported in various hardware test benches for monitoring the operation of a physical microprocessor chip in an electronic circuit as the microprocessor chip executes a computer program. However, to date, such debugging functionality has not been readily available for assisting in the testing and simulation of a software-based programmable core.

As programmable cores and core models continue to become more complex and rely on increasingly complex embedded programs, the need for debugging-type functionality during simulation will continue to increase. Therefore, a significant need exists in the art for a manner of supporting debugging functionality for use in conjunction with simulation of a programmable core.

SUMMARY OF THE INVENTION

The invention addresses these and other problems associated with the prior art by providing an apparatus, program product and method in which an enhanced programmable core model incorporates an embedded debug monitor to provide integrated graphical debugging functionality in the model. The debug monitor supports the performance of one or more debug operations on the programmable core model during simulation thereof. In addition, the debug monitor is configured to receive a debug parameter from a user through a graphical user interface, and report a result of the debug operation to a user via the graphical user interface. Through the use of a graphical user interface, interaction with a user is greatly facilitated. Moreover, by embedding the debug monitor within the programmable core model, a completely integrated simulation and debug environment may be provided to a user, with debugging functionality similar to that available to software developers and hardware-based processor designers. As a result, validation of a model's performance can be performed more efficiently and with less effort.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
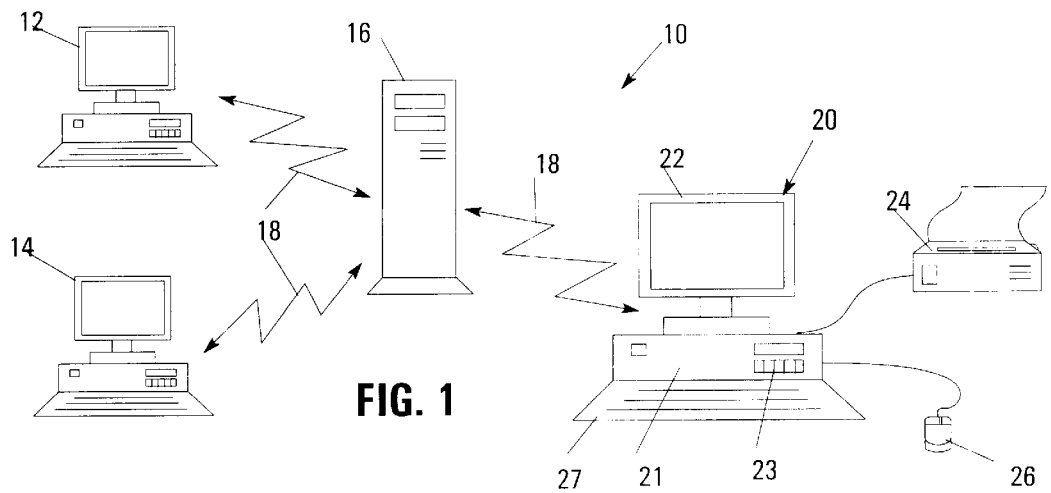
FIG. 1 is a block diagram of a networked computer system for use in designing and/or testing integrated circuit designs utilizing an enhanced programmable core model consistent with the invention.

The embodiments hereinafter focus on the usage and development of an enhanced programmable core model that incorporates graphical debugging functionality within the core model itself, thereby facilitating user debugging of integrated circuit designs that incorporate the core functionally represented by the model. While other implementations will be apparent to one of ordinary skill in the art having the benefit of the instant disclosure, such functionality in the illustrated implementation is incorporated into a debug monitor component embedded in the enhanced programmable core model, which runs alongside a modeled component during simulation and detects the occurrence of several different types of debugging events that are configurable by a user. Interaction with a user is provided through a debug graphical user interface component that is external to the enhanced programmable core model, but that interfaces with the debug monitor component to both control the debug monitor component and receive debugging information therefrom. Typically, the external debug GUI component is invoked directly by the debug monitor component during initialization of the programmable core model.

A programmable core model in the context of the invention typically represents a software-based functional model of a programmable integrated circuit component, which is most typically, but not necessarily, a relatively complex processing component such as a microprocessor or a programmable digital signal processor. Typically, a core model incorporates functional information formatted in a hardware description language such as VHDL or Verilog, and suitable for analysis using a simulator or like software tool. A programmable core model typically omits any physical layout or other synthesis information, and provides only information pertaining to the functionality of an integrated circuit component. In other embodiments, however, some synthesis information may be incorporated into an enhanced programmable core model consistent with the invention.

Typically, but not necessarily, a programmable core model also includes timing information for use by a simulator to accurately model the functionality of the underlying programmable core when fabricated using a particular fabrication technology. Programmable core models are also typically executable by a particular simulation platform. Some programmable core model designs, on the other hand, may be generic to fabrication technology and/or simulator platform.

A debug operation may include any number of debugging functions, including for example, single-step operations and multi-step operations for use in performing step-wise simulation, breakpoint operations to halt a simulation on occurrence of specific events, register display operations to display the states of one or more internal registers in a core model, disassemble operations to display instructions executed by a processor core, message display operations to display mode switches or other events to a user, trace operations to log any such information in a trace file, etc. A debug monitor consistent with the invention may implement any combination of the above-described debug operations consistent with the invention.

In the discussion hereinafter, the configuration and use of an enhanced programmable core model consistent with the invention is discussed prior to a discussion of the operations and tools utilized in developing such a model. Prior to either discussion, however, an exemplary hardware and software environment for use in both the use and development of an enhanced programmable core model consistent with the invention is presented.

Hardware and Software Environment

Turning to the Drawings, wherein like numbers denote like parts throughout the several views, FIG. 1 illustrates a computer system 10 for use in developing and/or testing an enhanced programmable core model consistent with the invention. Computer system 10 is illustrated as a networked computer system including one or more client computers 12, 14 and 20 (e.g., desktop or PC-based computers, workstations, etc.) coupled to server 16 (e.g., a PC-based server, a minicomputer, a midrange computer, a mainframe computer, etc.) through a network 18. Network 18 may represent practically any type of networked interconnection, including but not limited to local-area, wide-area, wireless, and public networks (e.g., the Internet). Moreover, any number of computers and other devices may be networked through network 18, e.g., multiple servers.

Client computer 20, which may be similar to computers 12, 14, may include a central processing unit (CPU) 21; a number of peripheral components such as a computer display 22; a storage device 23; a printer 24; and various input devices (e.g., a mouse 26 and keyboard 27), among others. Server computer 16 may be similarly configured, albeit typically with greater processing performance and storage capacity, as is well known in the art.

Figure 2:
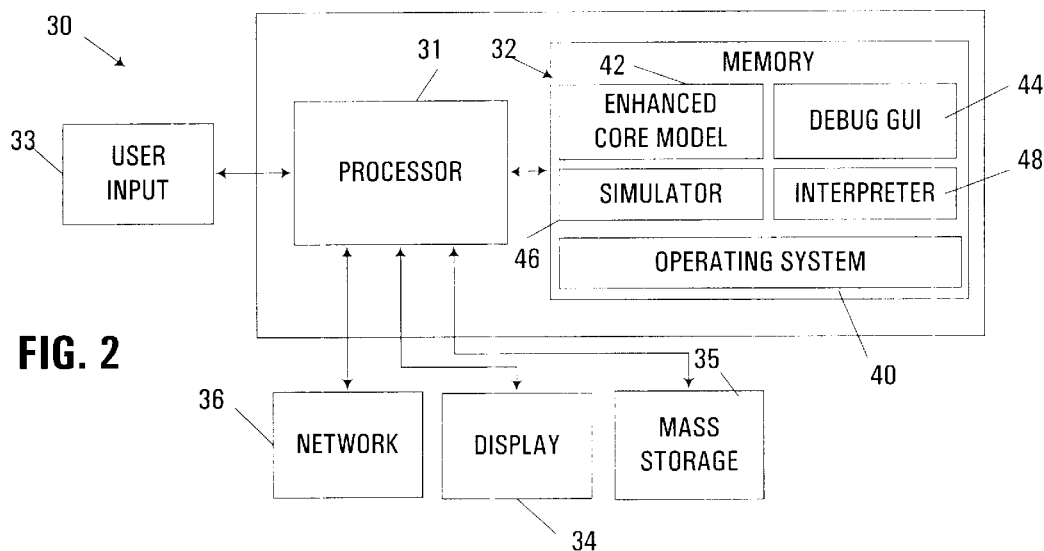
FIG. 2 is a block diagram of an exemplary hardware and software environment for a computer from the networked computer system of FIG. 1.

FIG. 2 illustrates in another way an exemplary hardware and software environment for an apparatus 30 consistent with the invention. For the purposes of the invention, apparatus 30 may represent practically any type of computer, computer system or other programmable electronic device, including a client computer (e.g., similar to computers 12, 14 and 20 of FIG. 1), a server computer (e.g., similar to server 16 of FIG. 1), a portable computer, a handheld computer, an embedded controller, etc. Apparatus 30 may be coupled in a network as shown in FIG. 1, or may be a stand-alone device in the alternative. Apparatus 30 will hereinafter also be referred to as a "computer", although it should be appreciated the term "apparatus" may also include other suitable programmable electronic devices consistent with the invention.

Computer 30 typically includes at least one processor 31 coupled to a memory 32. Processor 31 may represent one or more processors (e.g., microprocessors), and memory 32 may represent the random access memory (RAM) devices comprising the main storage of computer 30, as well as any supplemental levels of memory, e.g., cache memories, non-volatile or backup memories (e.g., programmable or flash memories), read-only memories, etc. In addition, memory 32 may be considered to include memory storage physically located elsewhere in computer 30, e.g., any cache memory in a processor 31, as well as any storage capacity used as a virtual memory, e.g., as stored on a mass storage device 35 or on another computer coupled to computer 30 via network 36.

Computer 30 also typically receives a number of inputs and outputs for communicating information externally. For interface with a user or operator, computer 30 typically includes one or more user input devices 33 (e.g., a keyboard, a mouse, a trackball, a joystick, a touchpad, and/or a microphone, among others) and a display 34 (e.g., a CRT monitor, an LCD display panel, and/or a speaker, among others).

For additional storage, computer 30 may also include one or more mass storage devices 35, e.g., a floppy or other removable disk drive, a hard disk drive, a direct access storage device (DASD), an optical drive (e.g., a CD drive, a DVD drive, etc.), and/or a tape drive, among others. Furthermore, computer 30 may include an interface with one or more networks 36 (e.g., a LAN, a WAN, a wireless network, and/or the Internet, among others) to permit the communication of information with other computers coupled to the network. It should be appreciated that computer 30 typically includes suitable analog and/or digital interfaces between processor 31 and each of components 32, 33, 34, 35 and 36 as is well known in the art.

Computer 30 operates under the control of an operating system 40, and executes or otherwise relies upon various computer software applications, components, programs, objects, modules, data structures, etc. (e.g., enhanced programmable core model 42, debug GUI script 44, simulator 46 and interpreter 48, among others). Moreover, various applications, components, programs, objects, modules, etc. may also execute on one or more processors in another computer coupled to computer 30 via a network 36, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions will be referred to herein as "computer programs", or simply "programs". The computer programs typically comprise one or more instructions that are resident at various times in various memory and storage devices in a computer, and that, when read and executed by one or more processors in a computer, cause that computer to perform the steps necessary to execute steps or elements embodying the various aspects of the invention. In addition, as will become more apparent below, the programs may represent logical or functional representations of an integrated circuit design, i.e., a functional model of an integrated circuit design suitable for interaction with a simulation tool. One such representative program is a programmable core model itself. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Those skilled in the art will recognize that the exemplary environments illustrated in FIGS. 1 and 2 are not intended to limit the present invention. Indeed, those skilled in the art will recognize that other alternative hardware and/or software environments may be used without departing from the scope of the invention.

Figure 3:
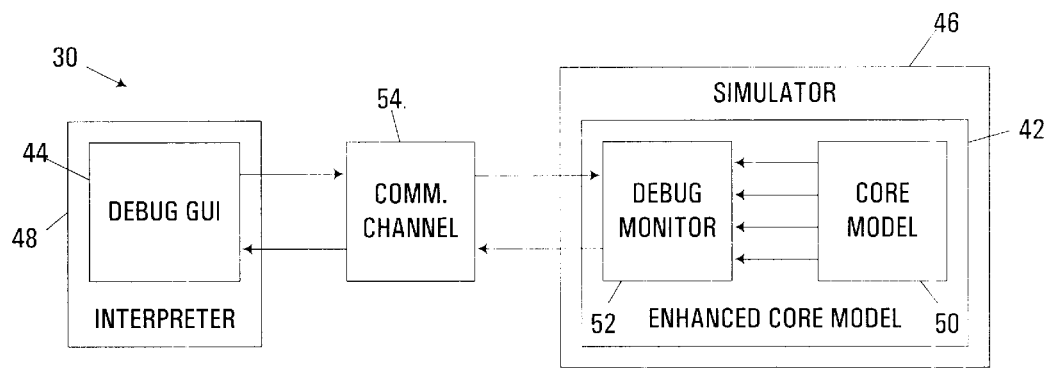
FIG. 3 is a block diagram illustrating various software components utilized in the computer of FIG. 2 to perform debugging with an enhanced programmable core model consistent with the invention.

Enhanced Programmable Core Model with Integrated Graphical Debugging Functionality FIG. 3 illustrates the primary software components in apparatus 30 for use in performing debugging of an enhanced core model 42 consistent with the invention. Enhanced core model 42 incorporates a programmable core model 50 that is integrated with an embedded debug monitor 52 within the enhanced core model, which is used to "spy" or monitor the state of the programmable core model during simulation of.the model by a simulator 46. User interface with the debug monitor is provided through a debug GUI script 44 executed by a script interpreter 48. Communication between the debug GUI script 44 and debug monitor 52 is provided through a communications channel 54, with debug parameters used to configure the debug monitor transmitted from the debug GUI script 44 to the debug monitor, and with results of the debug operations transmitted by the debug monitor 52 to the script for display to the user.

In the illustrated embodiment, simulator 46 may be implemented using any number of known simulators capable of simulating the functions of a core model and any integrated circuit design incorporating the same, including, for example, Modelsim from Mentor Graphics, Verilog XL or Verilog NC from Cadence, Gemini or Voyager from IKOS, VCS or VSS from Synopsys or Vantage from Viewlogic, among others. As such, enhanced core model 42 is typically implemented in a hardware description language such as VHDL or Verilog that functionally emulates the operation of the programmable core. As will become more apparent below, the enhanced core model may be generated using a model generator tool such as ModelGen from Arm Ltd., which targets a generic model to a specific simulator platform.

Typically, the ModelGen tool is used to take a C-language description of a generic model, typically in the form of a C-compiled netlist, and encapsulate the definition in a simulator-specific wrapper to generate a zero-delay simulation. The model ModelGen tool is then used to further encapsulate the model in a timing wrapper that defines the timing based upon a specific fabrication process. The ModelGen tool is also capable of permitting interaction with a simulator through the use of generic functions to control the simulator and obtain information therefrom. The ModelGen tool operates in two phases, a collation phase, where components defined in the form of drop ins are collected to represent a particular core model. In a second phase, referred to as a "target phase", the design is targeted for a specific simulator platform, with the specific functions implemented as required for that platform. Thereafter, timing behavior encapsulation occurs to generate a simulator-specific programmable core model.

To implement graphical debugging functionality within a programmable core model in the illustrated embodiment, the debug monitor is defined in an event-driven language such as C-language, and configured as one or more drop ins suitable for collation with a processor core model by the ModelGen tool into the enhanced programmable core model. The debug monitor typically includes a plurality of debug operation handlers that are invoked in response simulation events, e.g., the falling-edge of the main simulation clock. Therefore, the debug monitor essentially watches the states of the various nodes within the processor core model during execution of a simulation, and captures relevant information with regard to the state of various signals, registers, busses, etc.

It will be appreciated that a wide variety of alternate platforms and development tools may be utilized for implementing an enhanced processor core model consistent with the invention. Therefore, the invention is not limited the specific implementation herein.

Debug GUI script 44 in the illustrated embodiment is defined in an interpreted command language such as Tcl/Tk, which is commonly used to customize the operation of electronic design automation (EDA) and other software tools. Tcl is a language suitable for creating executable scripts that run on an interpreter. Tk is an extension of the Tcl command language for use in developing graphical interfaces without requiring users to manipulate large graphic libraries. The Tk language is based on minimal graphical elements called "widgets" that a developer can include in a graphical interface with little difficulty. Any number of known interpreters may be utilized in the illustrated implementation, including, for example, the WISH interpreter available from Mentor Graphics.

It will be appreciated that the graphical interface aspect of the debugging functionality discussed herein may be implemented in other scripting languages, or may be implemented using a programming model other than a script-based language (e.g., through operating system Application Programming Interfaces (API's) or other programming libraries). Moreover, the functions allocated between the debug GUI script and the debug monitor may alternately be allocated to different extents in each of the two components. Further, a debug monitor embedded within a programmable core model may also incorporate all of the necessary GUI functionality to provide graphical interface with a user. In general, other software organizational constructs may be used to implement the debugging functionality described herein.

Communication between debug monitor 52 and debug GUI script 44 is implemented in the illustrated embodiment through the use of a plurality of pipeline files, or "pipes" as supported by the UNIX family of operating systems.

The pipeline files in UNIX are relatively efficient communication mechanisms for communicating between tasks, as the files are written to and read from in a similar manner to standard files, but are typically maintained in the cache memory of a computer to speed access. UNIX pipeline files are also typically opened, read and written like standard UNIX files.

In the illustrated implementation, five pipelines are used. First, an instance pipeline is used to transmit an instance name from the debug monitor to the debug graphical user interface script. A configuration pipeline is used to send debug parameters from the script to the debug monitor to configure the operation of the debug monitor. A message pipeline is written to by the debug monitor to display simulation messages in a window opened by the script. Likewise, a disassembler pipeline and a register pipeline are each written to by the debug monitor for displaying in disassembled instructions and register contents in separate windows. It will be appreciated that other combinations of pipeline files, as well as other communication channel implementations may be used in the alternative. For example, other types of inter-process communication mechanisms, e.g., inter-process messages or remote procedure calls, may also be used.

Figure 4:
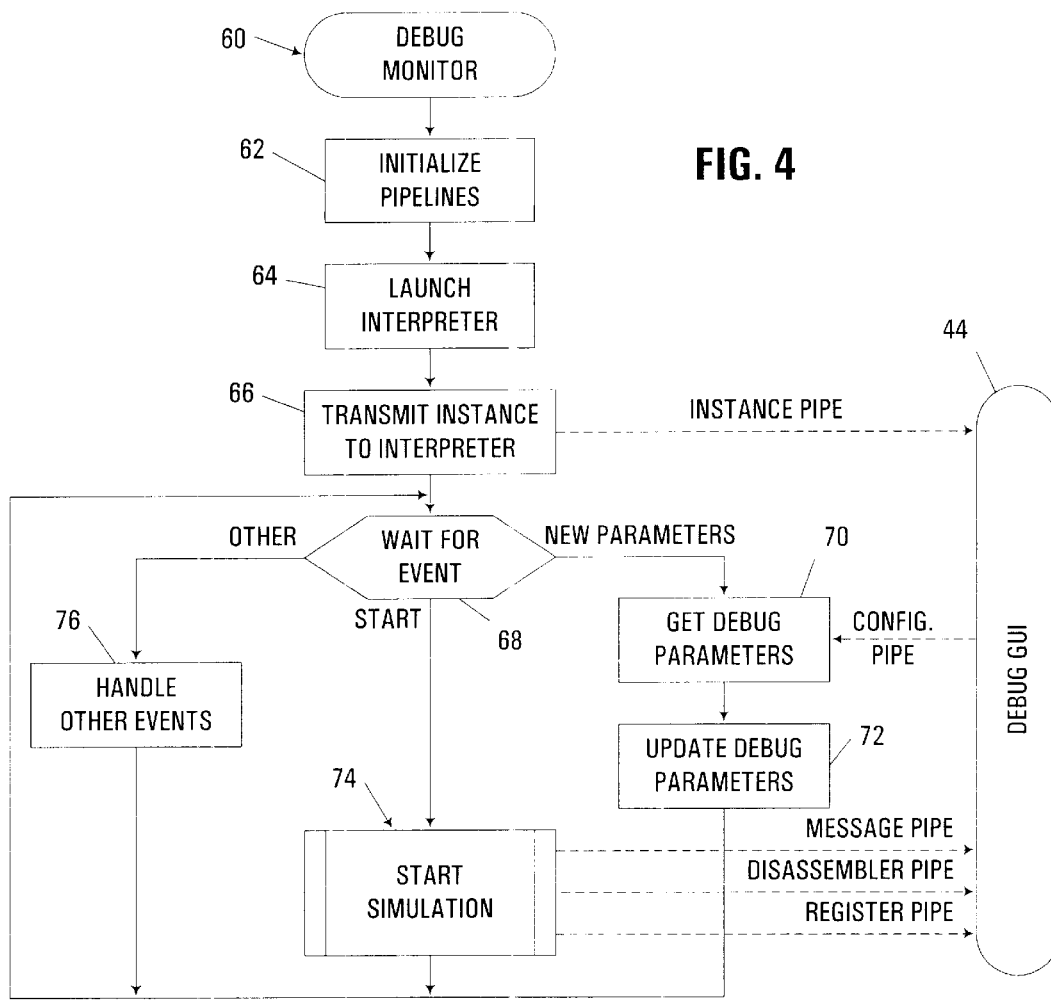
FIG. 4 is a flowchart illustrating the program flow of the debug monitor of FIG. 3.

FIG. 4 next illustrates at 60 an exemplary program flow for debug monitor 52, upon initialization of the debug monitor by the simulator. Typically, such initialization occurs as a step in the initialization of the enhanced programmable core model by the simulator.

Upon its creation, the debug monitor initializes the aforementioned pipelines in block 62, in a manner well known in the art. Next, block 64 launches the script interpreter to execute the debug GUI script. Initialization of the script may be performed, for example, by a "fork" function supported by UNIX to create the interpreter as a separate child process.

As mentioned above, any number of interpreters may be utilized depending upon the particular simulator platform. As such, if the debug monitor is written in a generic representation, it may be desirable to include compiler commands in the source code of the debug monitor to ensure the correct interpreter is executed when the core model is targeted to a specific simulator platform.

Next, in block 66, an instance identifier is transmitted to the interpreter using the instance pipe. The instance identifier is a unique identifier that distinguishes the debug monitor, and thus the specific programmable core model associated therewith. By doing so, multiple processor core models may be simulated concurrently in a multi-processor integrated circuit design, with multiple debug monitors concurrently monitoring the core models and displaying relevant debug information for each programmable core under simulation. In particular, providing separate instance identifiers enables the multiple instances of the debug monitor to transmit debug result information to the appropriate debug GUI script (if multiple scripts are executed) or for a single debug GUI script to sort the incoming debug result information, to ensure that the debug information for each core model is displayed in separate windows.

One manner of generating an instance identifier is to utilize a dynamic file name creation method that determines, prior to initializing any pipelines, if any pipelines already exist. If no such pipelines exist, pipes with an extension number of "1" may be appended to the various file names assigned to the pipeline files. If other pipelines exist, the highest extension number may be detected, and this value incremented to create new pipelines with a higher extension number. For the script, a similar mechanism may be utilized to associate a given instance of the script with a particular debug monitor, with the script detecting the highest extension number and utilizing such extension number as the current extension number to use for the pipelines to be associated with the script.

Returning to FIG. 4, block 68 next initiates an event-driven loop to wait for events directed to the debug monitor. One such event is the receipt of new parameters from the debug GUI script. In response to such an event, control passes to block 70 to obtain the debug parameters from the debug GUI script 44 through the configuration pipe. Next, the debug parameters for the debug monitor are updated in block 72, and control returns to block 68 to wait for additional events. Any number of data structures may be utilized to store the debug parameters in the debug monitor consistent with the invention.

Another event detected by block 68 is a "start" event, which results in the execution of a start simulation routine 74. A "start" event is generally invoked by a user attempting to start the simulation at a current point in the simulation. Once simulation is started, it is anticipated that debug result information will be transmitted to debug GUI script 44 by the debug monitor, typically via the message, disassembler and register pipes, as will be discussed in greater detail below.

Other events may be detected by block 68, but such events are not relevant to an understanding of the invention. Such other events (if any) are therefore handled in a conventional manner as illustrated in block 76.

Figure 5:
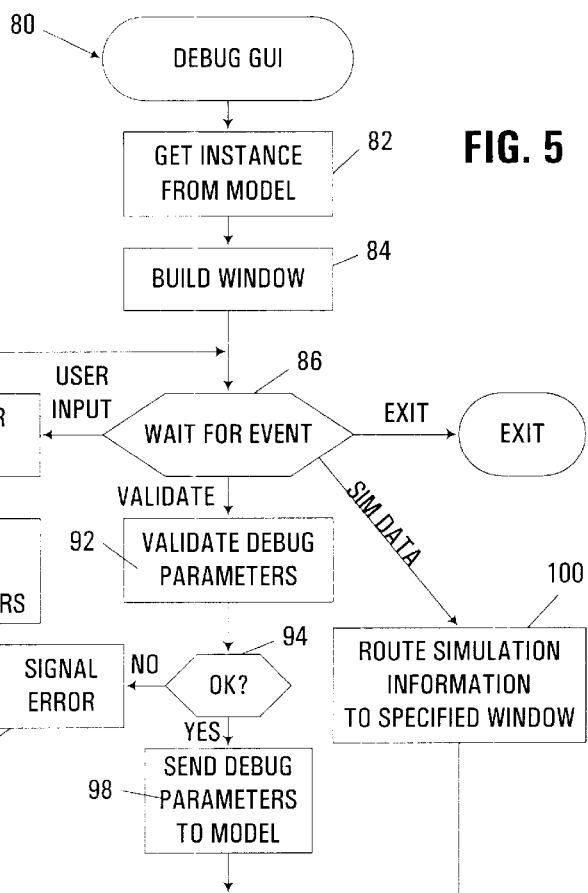
FIG. 5 is a flowchart illustrating the program flow of the debug GUI script of FIG. 3.

FIG. 5 next illustrates at 80 an exemplary program flow for the debug GUI script 44 executed by the interpreter in response to invocation of the interpreter by the debug monitor. First, in block 82, the instance identifier is received from the model via the instance pipe. Next, block 84 constructs a GUI window (referred to herein as a "debug features" window) for use with interacting with a user to receive debug parameters therefrom. The window constructed in block 84 typically includes a number input fields through which various debug parameters may be configured by a user, as well as a control suitable for updating the current debug parameters stored in the debug monitor.

Next, block 86 initiates an event-driven loop whereby various events passed to the script are handled. One type of event that may be processed by block 86, for example, is the receipt of user input, e.g., via selection of radio buttons, input of data into an input field, selection of an entry from a list box, depression of a button, etc. In response to any such user input, control passes to block 88 to obtain the user input from the event. Next, block 90 modifies the debug parameters stored by the script responsive to such user input. Control then returns to block 86.

Another event detected by block 86 is a validate event, which occurs whenever a user selects a "validate" button to validate, and if acceptable, forward the current debug parameters stored in the script to the debug monitor to modify the operation thereof. In response to such an event, control passes to block 92 to validate the current debug parameters—that is, to ensure that all of the debug parameters represent a valid combination of inputs. Next, block 94 determines whether the currently-selected debug parameters are acceptable. If any errors are detected, control passes to block 96 to display such errors to the user (typically in a text box in the window, or via a separate dialog box), and return control to block 86 without updating the debug monitor. If, on the other hand, the debug parameters are acceptable, control passes to block 98 to forward the debug parameters to the debug monitor via the configuration pipe discussed above. Control then returns to block 86.

The use of a validate button to update the debug monitor reduces the traffic between the script and debug monitor, and limits the potential for undesired debug parameters being stored in the debug monitor. It should be appreciated, however, that rather than updating the debug monitor only after depression of a button, the debug monitor may be updated any time the debug parameter selections are updated in the debug features window. In addition, parameter checking functionality may incorporated into the handling logic for new user input, e.g., to verify that certain user input is acceptable, prior to attempting to modify the debug parameters stored in the script in block 90. As but one example, it may be desirable to prohibit the simultaneous selection of two incompatible debug functions via the interface window, whereby receipt of user input to select one function may either be prohibited or may disable another function that is incompatible with the newly-selected function. It will be appreciated that a wide variety of user input functionalities may be supported consistent with the invention.

Returning to block 86, another event that may be detected is a simulation data event, which is generated in response to the receipt of simulation data (which in this case is debug result information) from the debug monitor via any of the register, message or disassembler pipes. In response to receipt of any such data, control passes to block 100 to route the simulation information, representing the results of a debug operation, to the appropriate window controlled by script 44. In particular, as described in greater detail below, it may be desirable to display register, message and disassembler information in separate windows, whereby block 100 results in the display of received information in the window appropriate therefor. In the alternative, a single window (even the debug features window) may be utilized to receive simulation information related to more than one type of data.

Returning again to block 86, another event that may be detected is an exit event, initiated, for example, in response to selection of an exit button in the debug features window. In response to such an event, script 44 is terminated.

Figure 6:
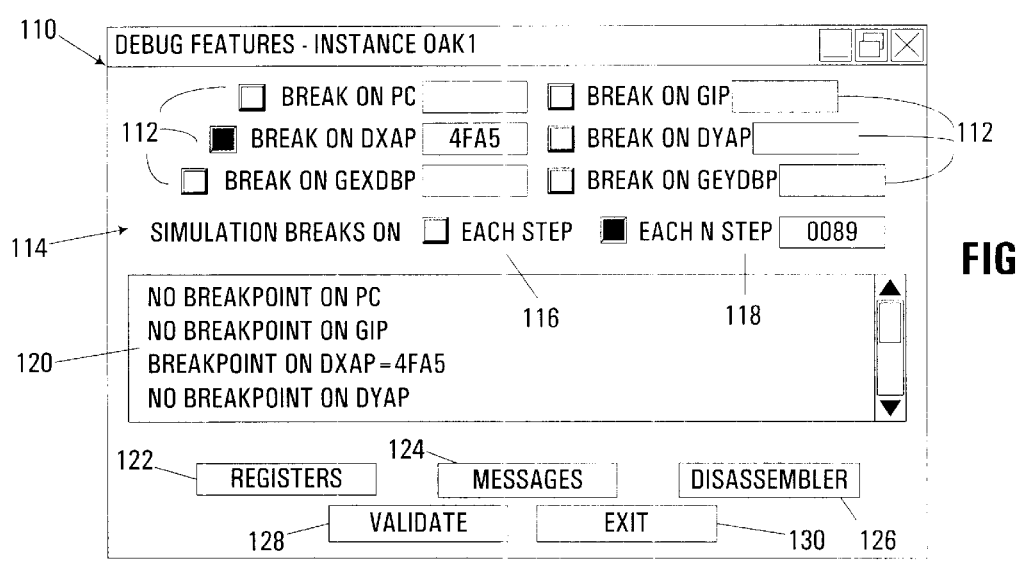
FIG. 6 is a block diagram of a representative graphical user interface window generated by the debug GUI script of FIG. 5.

It will be appreciated that a wide variety of graphical user interface components and tools may be utilized to select debug parameters, as well as receive debug result information consistent with the invention. FIG. 6, for example, illustrates an exemplary debug features window 110 suitable for interacting with a user when debugging a digital signal processor core model such as a core model that emulates the functionality of an OAKDSPCore, available from DSP Group, Inc. Window 110 may include a number of breakpoint selection controls 112 that permit a user to select various conditional breakpoints at which to stop execution of a simulation. For the OAKDSPCore core, for example, it may desirable to create breakpoints based upon the status of the program counter (PC), the instruction bus (GIP), the data address busses (DXAP and DYAP), and the data busses (GEXDBP and GEYDBP), such that values stored on each of these registers or busses will initiate a halting of a simulation. In addition, it may be desirable to provide step-wise execution controls 114, e.g., a single-step control 116 through which a user selects to halt the simulation after each clock cycle, or a multi-step control 118 that permits a user to halt the simulation after a selected number of cycles. It may be desirable to group controls 116 and 118 together to permit only one of controls 116 and 118 to be active at any given time.

Window 110 is also illustrated having a text display panel or box 120 that displays the current debug parameters selected by a user. In addition, other messages may be displayed in the window as desired, e.g., error messages responsive to improper input or instructional messages for use in assisting a user performing debug operations.

Window 110 also includes buttons 122, 124 and 126 to toggle the display of separate windows to which register, message and disassembler debug information are displayed to a user. Selecting any of buttons 122–126 a first time results in the display of a dedicated result window, while selection of any of buttons 122–126 a second time (while the associated window is displayed) results in closing of such window, and thus a lack of such information being displayed to the user. In the alternative, separate panels within window 110 or another window may be utilized to display the register, message and disassembler information, if desired.

Window 110 also includes a validate button 128, which is used to generate a "validate" event to validate and forward the currently-selected debug parameters to the debug monitor. In addition, an exit button 130 is provided to terminate the debug GUI script. Furthermore, the title bar of window 140 is illustrated as displaying an instance name for the associated processor core model, such that the debug script windows associated with concurrently-simulated models may be distinguished.

Figure 7:
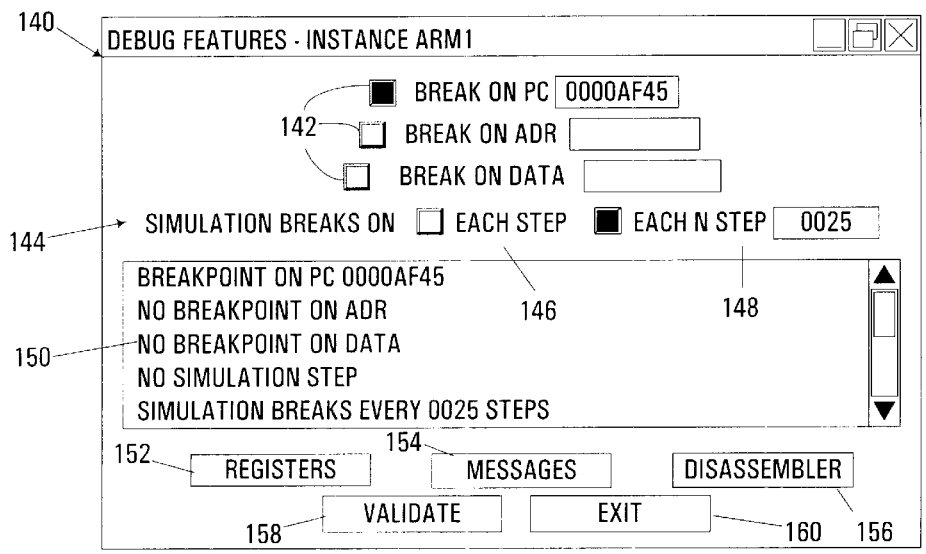
FIG. 7 is a block diagram of an alternate graphical user interface window to that of FIG. 6.

It will be appreciated that the specific types of debug operations supported in window 110 will vary greatly depending on the particular processor core being modeled, as well as the debugging functionality desired for the core. For example, FIG. 7 illustrates an alternate debug features window 140 suitable for providing interaction with a user for a microprocessor core, such as any of the ARM7TDMI microprocessor cores available from Arm Ltd. Window 140 includes breakpoint controls 142 that enable a user to halt a simulation in response to specific values stored in any of the program counter (PC), address bus (ADR) or data bus (DATA). Step controls 144, e.g., a single-step control 146 and a multi-step control 148, are provided to permit step-wise execution of a simulation. A text display panel or box 150 displays current debug parameters, as well as additional information to be presented to a user. Buttons 152, 154 and 156 respectively control the display of register, message and disassembler windows, while buttons 158 and 160 provide validate and exit functionality for the window.

Other processor cores may require other debugging functionality, and it will be appreciated that the appropriate window generated by the debug GUI script may be modified to accommodate such specialized debug parameters.

Figure 8:
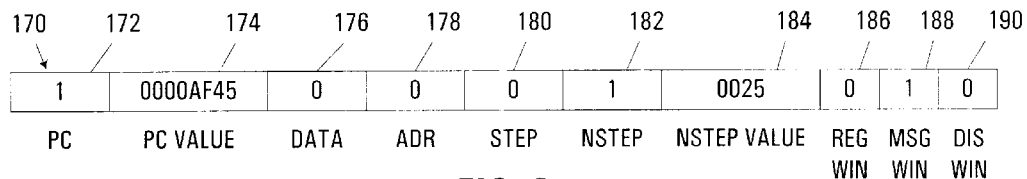
FIG. 8 is a block diagram of a debug parameter data structure generated by the debug GUI script of FIG. 5.

As discussed above, new debug parameters are typically transmitted to the debug monitor in response to selection of a validate button on a debug features window. Any number of data formats may be utilized to transmit the new debug parameters to the debug monitor. For example, as shown in FIG. 8, a dynamic data structure 170 may be utilized to transmit all of the current debug parameters to the debug monitor in response to selection of the validation button. With such a dynamic data structure, flags are sent indicating whether a particular debug operation is enabled. If so, any data associated with that enabled option is transmitted immediately subsequent to the flag. If a flag is not sent, no associated data is sent for that option.

FIG. 8 in particular illustrates an exemplary data structure representative of the debug parameters selected in window 140 of FIG. 7. Specifically, a set flag 172 indicates that a breakpoint is set on the program counter, with a field 174 immediately following flag 172 with the specific value to assign to the breakpoint. Since no breakpoints are established for either the address bus or the data bus, a pair of cleared flags 176, 178 are transmitted subsequent to field 174 to indicate the absence of any such breakpoints. In addition, a cleared flag 180 is transmitted to indicate that the single-step mode is disabled, while a set flag 182 is sent to indicate that the multi-step mode is selected. The value representative of the number of steps to execute between each simulation halt is provided in a field 184 immediately subsequent to flag 182. Subsequent to field 184, flags 186, 188 and 190 are sent to indicate whether the register, message or disassembler windows are active, respectively, and thus whether such information should be forwarded to the debug GUI script by the debug monitor during simulation. In data structure 170, only flag 188 is set to indicate that messages should be monitored and sent, but register and disassembler information should be ignored by the debug monitor.

It will be appreciated that any number of alternate data structures may be used in the alternative. Moreover, it will be appreciated that multiple breakpoints may be established for any given monitored parameter, e.g., multiple PC breakpoints, etc. As such, alternate user interface mechanisms may be utilized to select the breakpoints consistent with the invention, with the data structure used to transmit the debug parameters modified to distinguish between different breakpoint settings.

Figure 9:
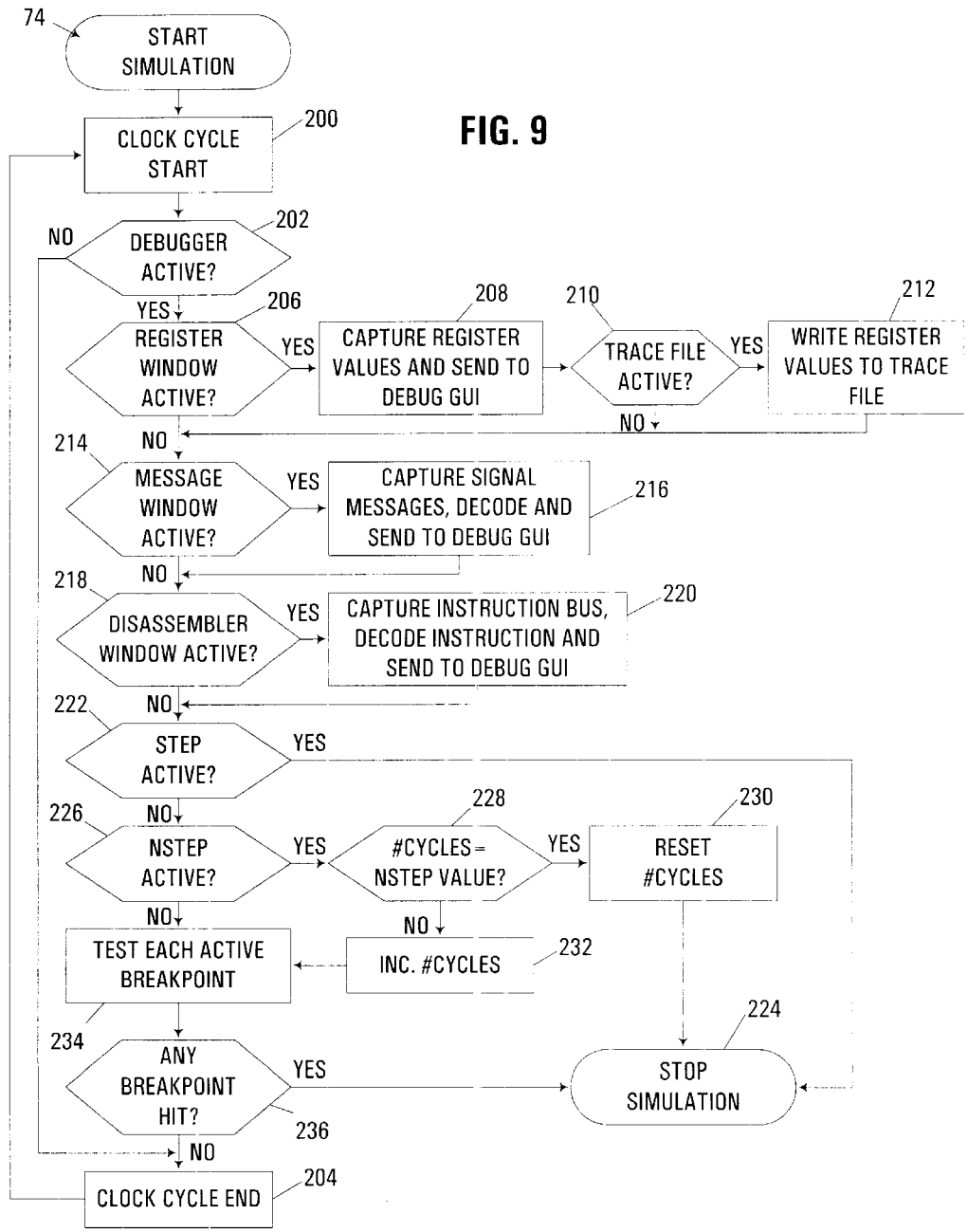
FIG. 9 is a flowchart illustrating the program flow of the start simulation routine referenced in FIG. 4.

Start simulation routine 74 is illustrated in greater detail in FIG. 9. In response to the start of a simulation, block 200 detects a clock cycle start event. Next, block 202 determines whether the debugger is active—that is, whether the user has activated the debug monitor. If not, control passes to block 204 to signify the end of the clock cycle, and control returns to block 200 to process the next clock cycle. If, however, the debugger is active, control passes to block 206 to determine whether the register window has been activated by a user.

If the register window is active, control passes to block 208 to capture the desired register values and send such values to the debug GUI script via the register pipe. The specific register contents to be monitored typically vary based upon the associated core model, and are programmed into a customized capture function in the debug monitor, as described below in connection with FIG. 10. Next, block 210 optionally determines whether a trace file is active. If so, control passes to block 212 to write the register values to the trace file. If no trace file is active, block 212 is bypassed. A trace file, which is not represented in either of windows 110 or 140, is an optional function whereby a user can record the status of registers at various simulation times in an external file for later analysis. As a component of writing the trace file, it may be desirable to obtain the simulation time and associate such time with the register values. Trace operations are well known debug operations in other environments, and as such, the implementation of such functionality into this specific application would be within the ability of one of ordinary skill in the art having the benefit of the instant disclosure.

After block 212, or if no trace file is active, block 214 determines whether the message window is active. If so, control passes to block 216 to capture any messages signaled by the processor core during the current cycle, decode such messages and send such messages to the debug GUI script via the message pipe. Various messages may be generated by a simulator. For example, one particular type of message that may be important for debugging functionality is a mode switch message, which is generated in response to a processor switching between various modes (e.g., supervisor, non-supervisor, user, etc.). Another type of message is a breakpoint or step message that indicates when a breakpoint is hit or when a step has occurred. Control then passes to block 218. Returning to block 214, if the message window is not active, block 216 is bypassed.

Block 218 next determines whether the disassembler window is active. If so, control passes to block 220 to capture the current state of the instruction bus, decode the instruction found thereon, and send the instruction to the debug GUI script via the disassembler pipe. If the disassembler window is not active, block 220 is bypassed.

Next, block 222 determines whether the single-step mode is activated. If so, control passes to block 224 to halt the simulation and return control to the user to either update the debug parameters, view the current results, or perform other activities until the user specifically commands the simulator to restart the simulation on the next clock cycle.

Returning to block 222, if the single-step mode is not active, block 226 determines whether the multi-step mode is active. If so, control passes to block 228 to determine whether the number of cycles since the last halting of the simulation (tracked via a cycle count variable) is equal to the number of cycles specified by the user in association with the multi-step option. If the number of cycles has been reached, control passes to block 230 to reset the cycle count and pass control to block 224 to halt the simulation. If, however, the number of cycles has not reached the selected value, control passes to block 232 to increment the cycle count. Control then passes to block 234. Returning to block 226, if the multi-step mode is not active, control passes directly to block 234.

Block 234 tests each active breakpoint to determine if any breakpoint enabled by a user has been hit on the current cycle. Typically, this is implemented for a given breakpoint by comparing the state of the monitored node in the processor core model that is associated with the breakpoint with the breakpoint value stored for the breakpoint. In other implementations, more complex breakpoint conditions may be used, e.g., whether a monitored node has a state that is greater than or less than a certain value, whether the monitored node has a state in a certain range, etc. A breakpoint may also be conditioned on the states of multiple nodes in a core model. Other known types of breakpoint conditions may also be implemented consistent with the invention.

Once all active breakpoints have been tested, block 236 determines whether any breakpoint was hit. If so, control passes to block 224 to halt the simulation. In addition, it may be desirable to pass a message to the script via the message pipe to indicate that the breakpoint was hit. If no breakpoint is hit, however, block 236 passes control to block 204 to indicate the end of a clock cycle, whereby control then returns to block 200 to wait for the next cycle of the simulation.

Figure 10:
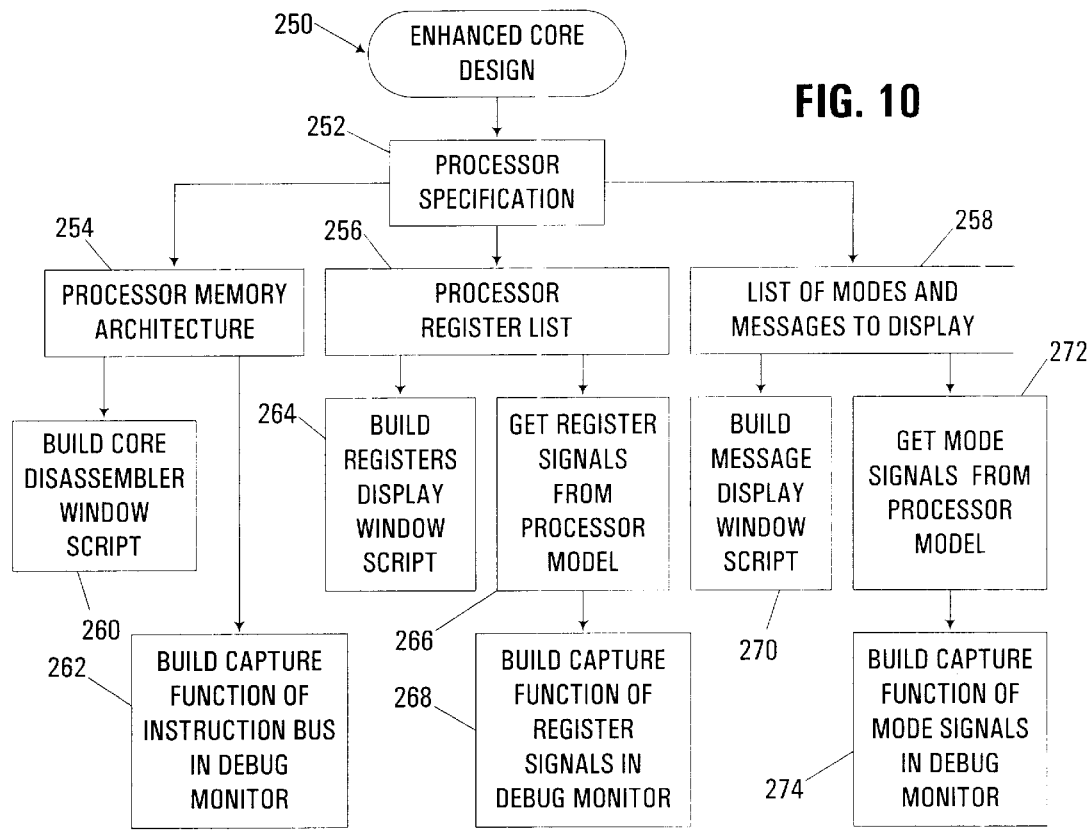
FIG. 10 is a flowchart illustrating the sequence of operations undertaken during design of an enhanced programmable core model consistent with the invention.

To develop an enhanced processor core model consistent with the invention, a design procedure similar to that illustrated at 250 in FIG. 10 may be used. Design of an enhanced core design begins at block 252, and is based upon the specification of a processor core, as illustrated at 252. From the processor specification, which may be an electronic or printed document, for example, a number of details about the processor core are collected, including the specific type of memory architecture for the processor, as represented at block 254, the list of relevant registers for the processor (which may include state flags for the processor as well), as represented at block 256, and a list of nodes and messages to display, as represented at block 258.

From this data, both the debug monitor and debug GUI script program code is developed. Typically, development of the debug monitor and script is based upon customizing and/or reusing generic library program code, to reduce the amount of effort required to create core-specific debug functionality. In the alternative, a debug monitor and debug GUI script may be generated from scratch based upon the collected information.

Based upon the specific memory architecture for the processor core, a core disassembler window script is generated at block 260, which determines the format of information to be displayed in the disassembler display window. From the standpoint of the debug monitor, a capture function is developed in block 262 to capture the instruction bus, and decode the instructions thereon, and forward the decoded instructions across a disassembler pipe.

The disassembler feature is desirable to enable a developer to watch each instruction executed by a processor core. In some instances, processor behavior can be complex, and instruction coding can be difficult due to pipelined architectures. As such, there may be more than one method of disassembling a processor instruction flow. One method is to observe the instruction bus and instruction fetch signals to determine which instruction is fed into the processor, which is the method utilized in the embodiment discussed above. However, it may not be suitable due to the pipelined nature of an architecture to determine the exact instruction executed during a given cycle. Nonetheless, when used with the program counter register display, a designer may still typically determine the sequence of instructions that are executed by a processor core under simulation. Another method of disassembling a processor instruction flow is to reproduce the pipeline structure in the processor core model and analyze specific nodes along the pipeline architecture to determine the sequence of operations occurring in response to a processor instruction.

With respect to the registers defined in the processor specification, a register window display script is built in block 264, and is configured to receive register state information over the register pipe and display such information in a register display window in an appropriate format for a developer. Likewise, from the standpoint of the debug monitor, the register signals are obtained from the processor model in block 266, then a suitable capture function is generated therefrom in block 268. One manner of doing so is to create in the debug monitor input busses connected to the register signals, with the debug monitor capture function capturing the state of each of these input busses on each cycle. Typically, it is desirable to link the display of registers to the falling clock event.

For the modes and other messages capable of being output by the simulator, a message display window script is generated in block 270 to provide an appropriate format for displaying messages to a user. Likewise, from the standpoint of the debug monitor, the appropriate mode signals are obtained from the processor model in block 272, and a capture function to output messages in response to such mode signals is built in block 274. For example, one type of message required for a suitable simulation is the display of a breakpoint being hit or a simulation step break being encountered. Another type of message is a mode change message, to detect, for example, when a processor core switches execution mode, e.g., via between supervisor or non-supervisor modes, to a user mode, to an interrupt mode, etc.

It is also typically desirable for a capture function to associate with any message a simulation time such that a user can match the simulation results with the message. Typically, simulator-specific API's may be utilized to obtain the time and time unit, as is well known in the art. For a generic model, it may be desirable to provide compiler commands to select different time query functions based upon the particular simulation platform used.

For additional debug operations, e.g., breakpoints, single-step and multi-step operations, the algorithmic flow described above in connection with FIG. 9 may be used. It will be appreciated that the specific nodes watched for the breakpoint, as well as the values upon which to break, may need to be modified from generic library breakpoint handlers. In general, the single-step and multi-step functions may be maintained in a generic state. Typically, any of the capture functions for the breakpoint and step operations are activated upon a falling edge of a clock as well.

It will be appreciated that generation of suitable scripts and debug monitor capture functions to implement the above-described functionality, e.g., in the Tcl/Tk and C-languages, would be well within the ability of one of ordinary skill in the art having the benefit of the instant disclosure.

Figure 11:
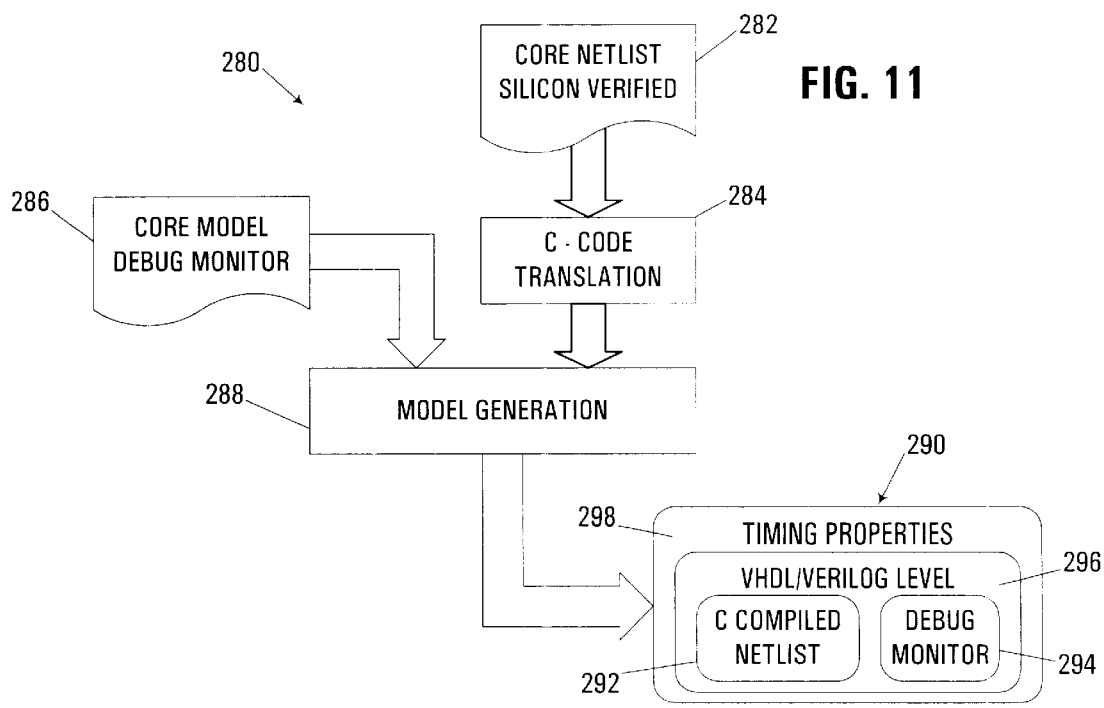
FIG. 11 is a dataflow diagram illustrating the software components utilized to generate an enhanced programmable core model consistent with the invention.

From the standpoint of a programmable core developer, it may be desirable to provide either generic cores suitable for compilation by users for a specific target platform, or in the alternative, it may be desirable to provide simulator-specific programmable cores. Moreover, as discussed above, it is often desirable to eliminate any physical layout information from a core model to protect the intellectual property investment in the core functionally represented thereby. FIG. 11 illustrates at 280, for example, a suitable process for developing a platform-specific programmable core model to satisfy the above-identified concerns. Any program core developer typically starts with a core netlist 282 developed in a hardware definition language and providing both functional and physical layout information associated with the core. Netlist 282 is illustrated as a silicon verified gate level netlist, obtained by synthesis of a Verilog or VHDL RTL core design.

To protect the intellectual property investment in the core, it is desirable to perform a C-code translation in block 284 to translate the netlist from gate level to a C-language functional representation thereof. Any number of translation tools, e.g., the IPGuard tool available from Escalade Corporation, may be used. As a result of such translation, the netlist structure cannot be retrieved or reverse engineered, yet the functional properties of the core are maintained.

Next, a debug monitor 286 developed in accordance with the design flow described above in connection with FIG. 10 is provided along with the translated netlist to a model generation tool 288 to generate an enhanced programmable core model consistent with the invention. The core model may be generated as a generic core model and independent of any particular simulator platform, e.g., using the Model-Gen tool available from Arm Ltd. To generate a functional and simulateable program core model, a model generation tool encapsulates the generic model into a simulator-specific programmable core model, e.g., as shown at 290 in FIG. 11. The simulator-specific programmable core model includes the C-compiled netlist 292 and debug monitor 294 encapsulated in a hardware description language (e.g., VHDL or Verilog) wrapper 296, as appropriate for the particular simulator to which the core model is directed. Wrapper 296 describes the inputs and outputs of the core block and calls the compiled netlist block and debug monitor as hierarchical child blocks to permit the core model to be integrated with the rest of an integrated circuit design to be synthesized.

Typically, the encapsulated programmable core model is defined in a "zero-delay" timing mode, and as such, targeting of a core model to a particular simulator platform incorporates further encapsulation using a timing properties wrapper 298 to provide timing data for use during simulation. The resulting enhanced programmable core model 290 is then suitable for simulation in an integrated circuit design on a simulator platform to which it is directed.

It will be appreciated that the development of an enhanced programmable core model in the manner discussed herein using the IPGuard and ModelGen tools would be well within the ability of one of ordinary skill in the art having the benefit of the instant disclosure. Moreover, other tools may be utilized to generate an enhanced programmable core model consistent with the invention. Therefore, the invention is not limited to the specific implementation disclosed herein.

Various modifications may also be made to the illustrated embodiments without departing from the spirit and scope of the invention. For example, additional interface options, e.g., text mode and file (or log) mode, may also be supported. Various state models may be used, e.g, two state ("zero" and "one") or four state (also including an unknown state and a high impendence state). In addition, programmable core models need not be developed from generic models, although doing so permits a core model provider to support multiple simulator platforms with relative ease. In addition, various manners of launching the debug script from a C-model may be used, including using specific API's to execute only one script instruction at a time, or using embedded Tk commands to build a graphic interface into C-code using the Tk language. As another alternative, a script may be compiled to obtain a binary file that could be launched using C-code.

Other modifications will be apparent to one of ordinary skill in the art. Therefore, the invention lies in the claims hereinafter appended.

What is claimed is:

1. A computer-implemented method of debugging a programmable core in an integrated circuit design, the method comprising:
    (a) performing simulation on a programmable core model that functionally emulates the programmable core, the programmable core model including an event-driven debug monitor embedded therein;
    (b) setting a debug parameter for the debug monitor in response to user input received through a graphical user interface;
    (c) performing a debug operation with the debug monitor during simulation of the programmable core model; and
    (d) reporting a result of the debug operation to a user via the graphical user interface.

2. The method of claim 1, wherein the debug operation is selected from a group consisting of a single-step operation, a multi-step operation, a register display operation, a disassemble operation, a trace operation, a breakpoint operation, a message display operation, a mode display operation, and combinations thereof.

3. The method of claim 1, further comprising executing a debug graphical user interface script to generate a parameter window on a computer display, wherein setting the debug parameter includes receiving user input directed to the parameter window.

4. The method of claim 3, wherein the debug monitor is configured to activate the debug graphical user interface script during initialization of the debug monitor.

5. The method of claim 3, further comprising establishing a communication channel between the debug monitor and the debug graphical user interface script, wherein setting the debug parameter includes transmitting the debug parameter from the graphical user interface script to the debug monitor over the communication channel, and wherein reporting the result of the debug operation includes transmitting the result from the debug monitor to the graphical user interface script over the communication channel.

6. The method of claim 5, wherein the communication channel includes a plurality of pipelines.

7. The method of claim 5, further comprising generating at least one of a message, register, and disassembler window, wherein reporting the result of the debug operation further includes displaying the result in one of the message, register and disassembler windows.

8. The method of claim 1, wherein performing the debug operation includes detecting a clock cycle start event that occurs during performance of the simulation and performing the debug operation responsive to the clock cycle start event.

9. The method of claim 1, wherein the programmable core model is a first programmable core model and the debug monitor is a first debug monitor, the method further comprising:
    (a) assigning a first instance identifier to the first programmable core model;
    (b) performing simulation on a second programmable core model associated with a second instance identifier concurrently with performing simulation on the first programmable core model, the second programmable core model including a second debug monitor;
    (c) performing a debug operation on the second programmable core model with the second debug monitor during performance of the simulation on the second programmable core model; and
    (d) reporting a result of the second debug operation to the user via the graphical user interface.

10. The method of claim 1, wherein performing the debug operation includes capturing state information from the programmable core model at a predetermined time during the simulation using the debug monitor.

11. The method of claim 10, wherein capturing the state information includes capturing at least one of a register value, a current instruction, a message, and a processor mode.

12. An apparatus, comprising:
    (a) a memory;
    (b) a programmable core model resident in the memory, the programmable core model configured to functionally emulate a programmable core in an integrated circuit design; and
    (c) a program comprising an event-driven debug monitor embedded in the programmable core model, the program configured to simulate the programmable core model, set a debug parameter for the debug monitor in response to user input received through a graphical user interface, perform a debug operation with the debug monitor during simulation of the programmable core model, and report a result of the debug operation to a user via the graphical user interface.

13. The apparatus of claim 12, wherein the debug operation is selected from a group consisting of a single-step operation, a multi-step operation, a register display operation, a disassemble operation, a trace operation, a breakpoint operation, a message display operation, a mode display operation, and combinations thereof.

14. The apparatus of claim 12, wherein the program further comprises a simulator.

15. The apparatus of claim 12, wherein the program further comprises a debug graphical user interface script configured to generate a parameter window on a computer display, wherein the program is configured to set the debug parameter by receiving user input directed to the parameter window and transmitting the debug parameter to the debug monitor.

16. The apparatus of claim 15, wherein the debug monitor is configured to activate the debug graphical user interface script during initialization of the debug monitor.

17. The apparatus of claim 15, wherein the program is further configured to establish a communication channel between the debug monitor and the debug graphical user interface script, wherein the program is configured to set the debug parameter further by transmitting the debug parameter from the graphical user interface script to the debug monitor over the communication channel, and to report the result of the debug operation by transmitting the result from the debug monitor to the graphical user interface script over the communication channel.

18. The apparatus of claim 17, wherein the communication channel includes a plurality of pipelines.

19. The apparatus of claim 17, wherein the program is further configured to generate at least one of a message, register, and disassembler window, and to report the result of the debug operation further by displaying the result in one of the message, register and disassembler windows.

20. The apparatus of claim 12, wherein the program is configured to perform the debug operation by detecting a clock cycle start event that occurs during performance of the simulation and performing the debug operation responsive to the clock cycle start event.

21. The apparatus of claim 12, wherein the programmable core model is a first programmable core model associated with a first instance identifier and the debug monitor is a first debug monitor, the apparatus further comprising a second programmable core model associated with a second instance identifier and including a second debug monitor, wherein the program is further configured to concurrently simulate the first and second programmable core models and perform a second debug operation on the second programmable core model with the second debug monitor during the simulation.

22. The apparatus of claim 12, wherein the program is configured to perform the debug operation by capturing state information from the programmable core model at a predetermined time during the simulation using the debug monitor.

23. The apparatus of claim 22, wherein the program is configured to capture the state information by capturing at least one of a register value, a current instruction, a message, and a processor mode.

24. A program product, comprising:

(a) a programmable core model configured to functionally emulate a programmable core in an integrated circuit design, the programable core model including an event-driven debug monitor embedded therein, the debug monitor configured to receive a debug parameter from a user through a graphical user interface, perform a debug operation during simulation of the programmable core model, and report a result of the debug operation to a user via the graphical user interface; and (b) a signal bearing medium bearing the programmable core model.

25. The program product of claim 24, wherein the signal bearing medium includes at least one of a transmission medium and a recordable medium.

26. The program product of claim 24, wherein the debug operation is selected from a group consisting of a single-step operation, a multi-step operation, a register display operation, a disassemble operation, a trace operation, a breakpoint operation, a message display operation, a mode display operation, and combinations thereof.

27. The program product of claim 24, wherein the programmable core model is configured to be executed on a simulator.

28. The program product of claim 24, wherein the debug monitor is configured to activate a debug graphical user interface script during initialization of the debug monitor.

29. The program product of claim 28, wherein the debug monitor is further configured to establish a communication channel between the debug monitor and the debug graphical user interface script.

30. The program product of claim 24, the debug monitor is configured to perform the debug operation by detecting a clock cycle start event that occurs during performance of the simulation and performing the debug operation responsive to the clock cycle start event.

31. The program product of claim 30, wherein the debug monitor is configured to perform the debug operation by capturing state information from the programmable core model at a predetermined time during the simulation.

32. The program product of claim 31, wherein the debug monitor is configured to capture the state information by capturing at least one of a register value, a current instruction, a message, and a processor mode.

33. The program product of claim 24, wherein the programmable core model further comprises:

(a) a compiled netlist emulating the functionality of the programmable core in a simulator-generic representation;

(b) a simulator shell encapsulating the compiled netlist and the debug monitor and configured to interface the compiled netlist and the debug monitor with the simulator; and (c) a timing shell encapsulating the simulator shell and providing timing data for use by the simulator in simulating the programmable core.

34. The program product of claim 33, wherein the compiled netlist and debug monitor are defined in a c programming language.

* * * * *